United States Patent
Kim et al.

(10) Patent No.: US 7,276,740 B2
(45) Date of Patent: Oct. 2, 2007

(54) SUBMOUNT FOR LIGHT EMITTING DEVICE

(75) Inventors: Hyung-kun Kim, Suwon-si (KR);
Su-hee Chae, Suwon-si (KR);
Tae-hoon Jang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 42 days.

(21) Appl. No.: 11/372,204

(22) Filed: Mar. 10, 2006

(65) Prior Publication Data
US 2006/0249744 A1    Nov. 9, 2006

(30) Foreign Application Priority Data
May 7, 2005    (KR)    ............ 10-2005-0038202

(51) Int. Cl.
*H01L 33/00*    (2006.01)
(52) U.S. Cl. ............ 257/99; 257/100; 257/778; 257/E33.057
(58) Field of Classification Search ............ 257/99, 257/100, 778, E33.056, E33.057
See application file for complete search history.

(56) References Cited

U.S. PATENT DOCUMENTS

| | | | |
|---|---|---|---|
| 6,720,664 B1* | 4/2004 | Teng et al. | 257/778 |
| 6,740,906 B2* | 5/2004 | Slater et al. | 257/99 |
| 7,196,356 B2* | 3/2007 | Ishii et al. | 257/81 |
| 7,215,020 B2* | 5/2007 | Nakase et al. | 257/706 |
| 2007/0007540 A1* | 1/2007 | Hashimoto et al. | 257/94 |

* cited by examiner

*Primary Examiner*—T. N. Quach
(74) *Attorney, Agent, or Firm*—Buchanan Ingersoll & Rooney PC

(57) ABSTRACT

A submount for a light emitting device package is provided. The submount includes a substrate; a first bonding layer and a second bonding layer which are separately formed on the substrate; a first barrier layer and a second barrier layer which are formed on the first bonding layer and on the second bonding layer, respectively; a first solder and a second solder which are formed on the first barrier layer and on the second barrier layer, respectively; and a first blocking layer and a second blocking layer which are formed around the first barrier layer and the second barrier layer, blocking the melted first solder and the melted second solder from overflowing during a flip chip process.

13 Claims, 7 Drawing Sheets

SUBMOUNT FOR LIGHT EMITTING DEVICE

CROSS-REFERENCE TO RELATED PATENT APPLICATION

This application claims the benefit of Korean Patent Application No. 10-2005-0038202, filed on May 7, 2005, in the Korean Intellectual Property Office, the disclosure of which is incorporated herein in its entirety by reference.

BACKGROUND OF THE DISCLOSURE

1. Field of the Disclosure

The present disclosure relates to a submount for a light emitting device package, and more particularly, to a submount for a light emitting device package for preventing a short in the light emitting device.

2. Description of the Related Art

In general, light emitting devices such as light emitting diodes (LED) and laser diodes (LD) are packaged by being connected to a submount through a flip chip process.

FIG. 1 is a plane view of a conventional submount for a light emitting device package, and FIG. 2 is a cross-sectional view cut along line A-A' of FIG. 1. Referring to FIGS. 1 and 2, a first bonding layer 12a and a second bonding layer 12b are formed separately on a substrate 10 formed of a ceramic. The first bonding layer 12a and the second bonding layer 12b are formed of a highly conductive metal such as Au. A first barrier layer 14a and a second barrier layer 14b are formed to a predetermined width on the first bonding layer 12a and the second bonding layer 12b, respectively. A first solder 16a and a second solder 16b are formed on the first barrier layer 14a and the second barrier layer 14b. The first barrier layer 14a and the second barrier layer 14b prevent interdiffusion between the first solder 16a and the first bonding layer 12a, and between the second solder 16b and the second bonding layer 12b when the first solder 16a and the second solder 16b are melted through a flip chip process, and are generally formed of Pt.

However, in the conventional submount, the first solder 16a and the second solder 16b are melted and may be mixed together during the flip chip process. Thus, as shown in FIG. 3, a solder bridge 16' which connects the first barrier layer 14a and the second barrier layer 14b electrically can be formed.

Accordingly, when the solder bridge 16' is formed, a short occurs in a light emitting device package.

SUMMARY OF THE DISCLOSURE

The present invention may provide a submount for a light emitting device package, which prevents a short in the light emitting device.

According to an aspect of the present invention, there may be provided a submount for a light emitting device package comprising: a substrate; a first bonding layer and a second bonding layer which are separately formed on the substrate; a first barrier layer and a second barrier layer which are formed on the first bonding layer and on the second bonding layer, respectively; a first solder and a second solder which are formed on the first barrier layer and on the second barrier layer, respectively; and a first blocking layer and a second blocking layer which are formed around the first barrier layer and the second barrier layer, blocking the melted first solder and the melted second solder from overflowing during a flip chip process.

The first blocking layer and the second blocking layer may be formed at a predetermined distance from the first barrier layer and the second barrier layer on the first bonding layer and the second bonding layer, respectively. The first blocking layer and the second blocking layer may be formed on both sides of the first barrier layer and the second barrier layer, respectively. The first blocking layer and the second blocking layer may surround the first barrier layer and the second barrier layer, respectively.

The first blocking layer and the second blocking layer may have a thickness greater than the thickness of the first barrier layer and the second barrier layer. The first blocking layer and the second blocking layer may have the same thickness as the first barrier layer and the second barrier layer.

The first barrier layer and the second barrier layer may be formed in strips of a predetermined width. A groove may be further formed in at least one of the first bonding layer and the second bonding layer where ends of the first barrier layer and the second barrier layer are located.

A plurality of first barrier layers or second barrier layers may be formed.

The first blocking layer and the second blocking layer may be formed of the same material as the material of the first barrier layer and the second barrier layer. The first blocking layer and the second blocking layer may be formed of at least a material selected from the group consisting of Pt, Cr, and Ti.

The first bonding layer and the second bonding layer may be formed of Au, Ag, or Al and the substrate may be formed of a ceramic or Si.

BRIEF DESCRIPTION OF THE DRAWINGS

The above and other features and advantages of the present invention will be described in detailed exemplary embodiments thereof with reference to the attached drawings in which.

DETAILED DESCRIPTION OF PREFERRED EMBODIMENTS

Figure 1:
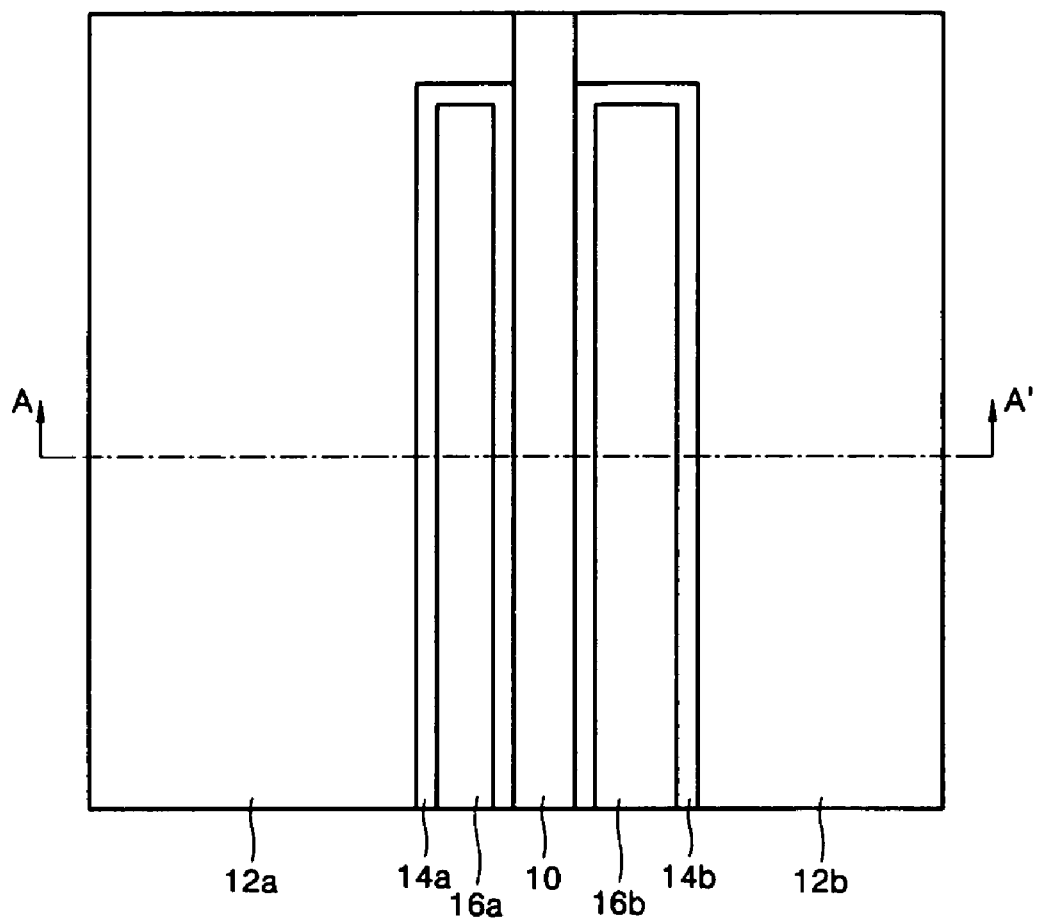
FIG. 1 is a plane view of a conventional submount for a light emitting device package.
Figure 2:
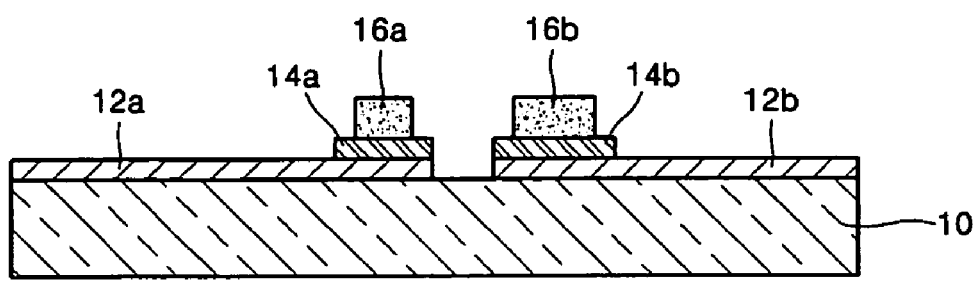
FIG. 2 is a cross-sectional view cut along line A-A' line of FIG. 1.
Figure 3:
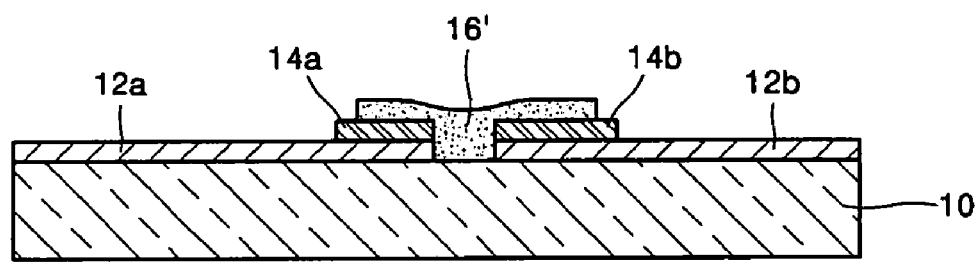
FIG. 3 is a cross-sectional view showing a solder bridge formed of a melted solder in a flip chip process for the submount of FIG. 1.

Preferred embodiments of the present invention will now be described with reference to the attached drawings. Like reference numerals in the drawings denote like elements.

Figure 4:
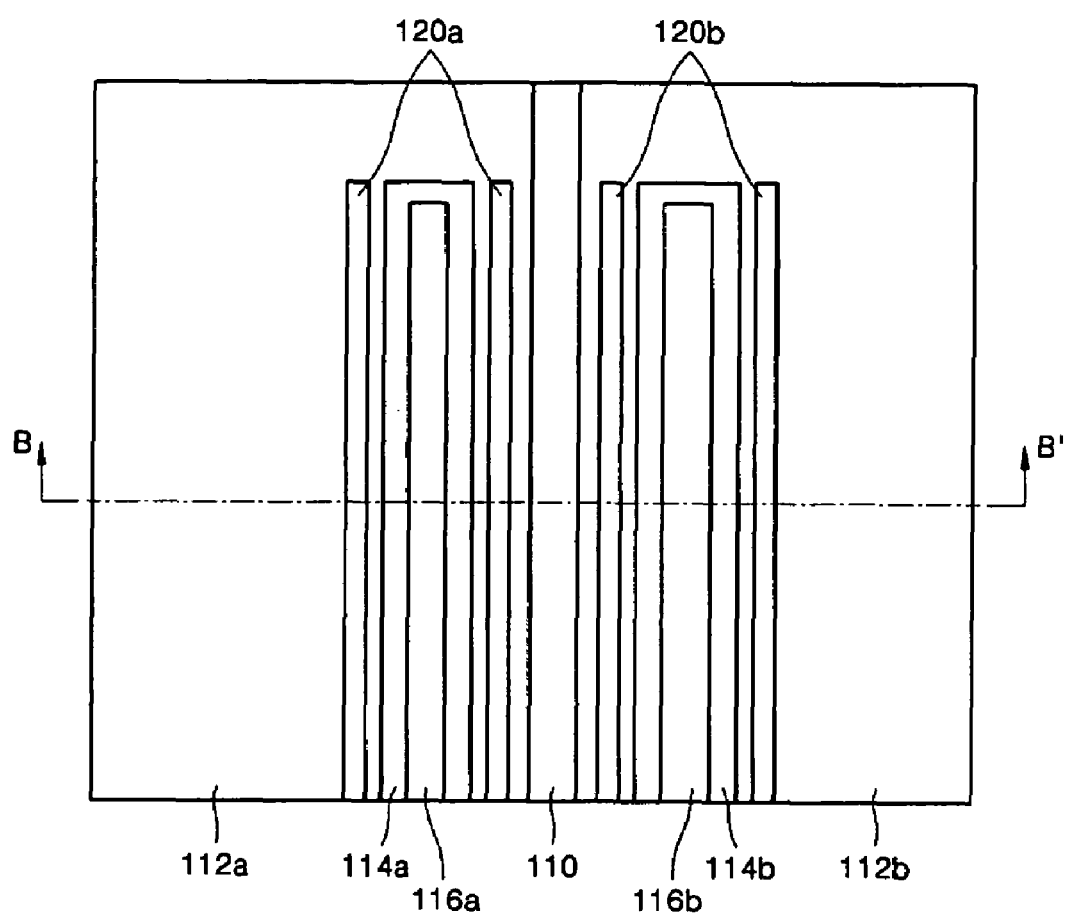
FIG. 4 is a plane view of a submount for a light emitting device package according to an embodiment of the present invention.
Figure 5:
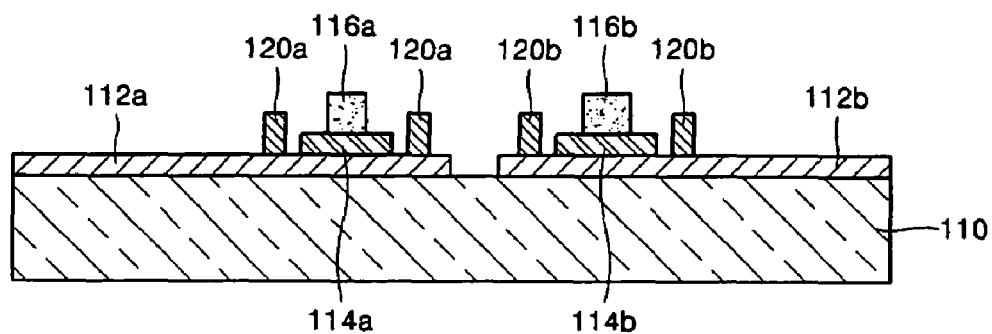
FIG. 5 is a cross-sectional view cut along line B-B' of FIG. 4.

FIG. 4 is a plane view of a submount for a light emitting device package according to an embodiment of the present invention. FIG. 5 is a cross-sectional view cut along line B-B' of FIG. 4.

Referring to FIGS. 4 and 5, a first bonding layer 112a and a second bonding layer 112b are formed on a substrate 110 with a predetermined distance therebetween. The substrate 110 can be formed of an material such as a ceramic or Si. The first bonding layer 112a and the second bonding layer 112b can be formed of a highly conductive metal such as Au, Ag, or Al, that can be easily adhered to a first solder 116a and a second solder 116b which will be described later.

A first barrier layer 114a and a second barrier layer 114b are formed on the first bonding layer 112a and the second bonding layer 112b, respectively. The first barrier layer 114a and the second barrier layer 114b are formed in parallel strips of a predetermined width. The first barrier layer 114a and the second barrier layer 114b prevent interdiffusion between the first solder 116a and the first bonding layer 112a and between the second solder 116b and the second bonding layer 112b during a flip chip process. The first barrier layer 114a and the second barrier layer 114b can be formed of at least metal selected from the group consisting of Pt, Cr, and Ti. The first solder 116a and the second solder 116b are formed on the first barrier layer 114a and the second barrier layer 114b, respectively. The first solder 116a bonds one of electrode layers of the light emitting device (not shown) and the first barrier layer 114a. The second solder 116b bonds the other of electrode layers of the light emitting device and the second barrier layer 114b. The first solder 116a and the second solder 116b may be generally formed of an alloy having good melting property and high conductivity. The first solder 116a and the second solder 116b can be formed to have widths equal to or less than those of the first barrier layer 114a and the second barrier layer 114b, respectively.

First blocking layers 120a and second blocking layers 120b are formed along the first barrier layer 114a and the second barrier layer 114b on the first bonding layer 112a and the second bonding layer 112b, respectively. The first blocking layers 120a and the second blocking layers 120b block the melted first solder 116a and the second solders 116b from overflowing on the first bonding layer 112a and the second bonding layer 112b during a flip chip process when a light emitting device is bonded on a submount according to the present embodiment by a flip chip process. The first blocking layers 120a and the second blocking layers 120b may be formed at a predetermined distance from the first barrier layer 114a and the second barrier layer 114b so that the upper surfaces of the first bonding layer 112a and the second bonding layer 112b can be exposed. Thus, during the flip chip process the melted first solder 116a and the second solder 116b can adhere to a upper surface of the first bonding layer 112a and the second bonding layer 112b, thereby improving the bonding characteristic. Also, the first blocking layer 120a and the second blocking layer 120b can be formed to surround the first barrier layer 114a and the second barrier layer 114b at a predetermined distance from the first barrier layer 114a and the second barrier layer 114b.

The first blocking layer 120a and the second blocking layer 120b may be formed of a material having a low adhesion characteristic to the melted first solder 116a and the melted second solder 116b to improve the bonding characteristic between the first solder 116a and the first bonding layer 112a and between the second solder 116b and the second bonding layer 112b. The first blocking layer 120a and the second blocking layer 120b can be formed of the same material as the first barrier layer 114a and the second barrier layer 114b. Thus, the first blocking layer 120a and the second blocking layer 120b can be formed of at least a metal selected from the group consisting of Pt, Cr, and Ti.

The first blocking layer 120a and the second blocking layer 120b may be formed to a thickness greater than those of the first barrier layer 114a and the second barrier layer 114b. Also, the first blocking layer 120a and the second blocking layer 120b may be formed to the same thickness as those of the first barrier layer 114a and the second barrier layer 114b. In this case the first blocking layer 120a and the second blocking layer 120b and the first barrier layer 114a and the second barrier layer 114b can be formed on the upper surface of the first bonding layer 112a and the second bonding layer 112b at the same time.

Figure 6:
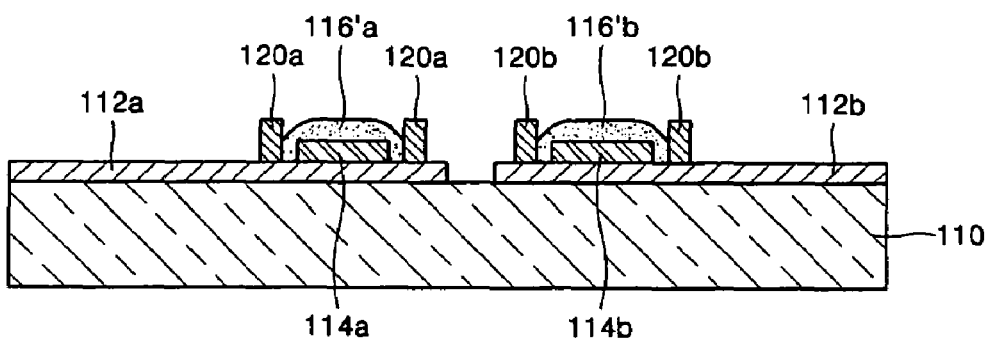
FIG. 6 is a cross-sectional view showing a melted solder formed in a flip chip process for the submount of FIG. 4.

FIG. 6 shows a melted solder in a flip chip process for the submount of FIG. 4. Referring to FIG. 6, a melted first solder 116'a flows and adheres to the upper surface of the first bonding layer 112a between the first barrier layer 114a and the first blocking layer 120a, thereby improving the bonding characteristic. The first blocking layer 120a prevents the melted first solder 116'a from overflowing on the first bonding layer 112a. A melted second solder 116'b flows and adheres to the upper surface of the second bonding layer 112b between the second barrier layer 114b and the second blocking layer 120b. The second blocking layer 120b prevents the melted first solder 116'b from overflowing on the second bonding layer 112b. The first blocking layer 120a and the second blocking layer 120b prevent the melted first solder 116'a and the melted second solder 116'b from overflowing, and thus a short in a light emitting device can be avoided. In particular, a short occurs in over 30% of the light emitting device packages employing the conventional submount of FIG. 1, but only in about 5% of the light emitting device packages employing the submount according to the present embodiment.

Figure 7:
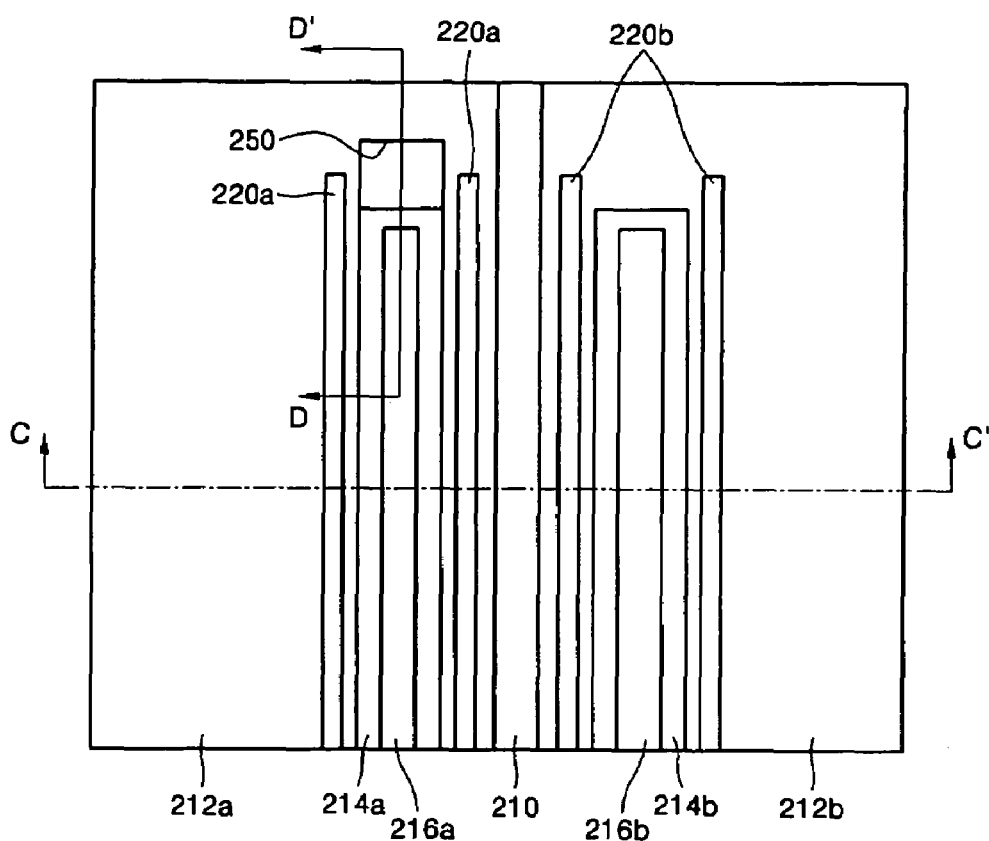
FIG. 7 is a plane view of a submount for a light emitting device package according to another embodiment of the present invention.
Figure 8:
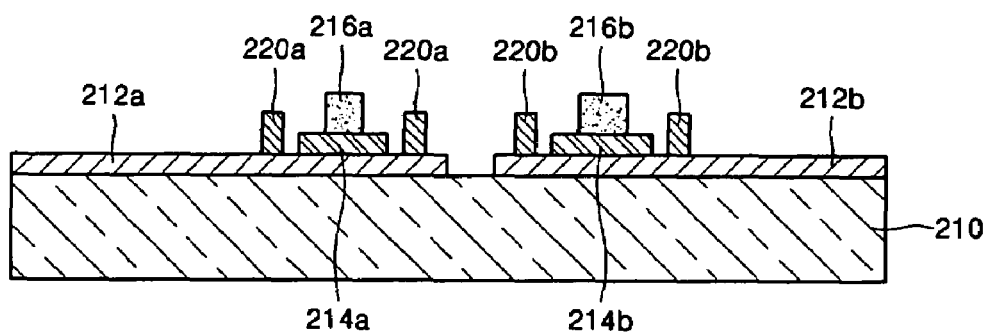
FIG. 8 is a cross-sectional view cut along line C-C' of FIG. 7.
Figure 9:
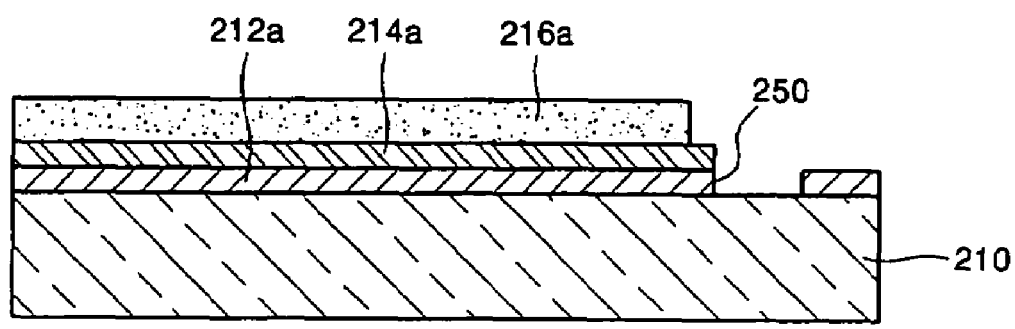
FIG. 9 is a cross-sectional view cut along line D-D' of FIG. 7.

FIG. 7 is a plane view of a submount for a light emitting device package according to an embodiment of the present invention. FIG. 8 is a cross-sectional view cut along line C-C' of FIG. 7. FIG. 9 is a cross-sectional view cut along line D-D' of FIG. 7.

Referring to FIGS. 7 through 9, a first bonding layer 212a and a second bonding layer 212b are formed on a substrate 210 with a predetermined distance therebetween. A first barrier layer 214a and a second barrier layer 214b are formed on the first bonding layer 212a and the second bonding layer 212b to a predetermined width, respectively. The first barrier layer 214a and the second barrier layer 214b can be formed of a metal selected from the group consisting of Pt, Cr, and Ti. A first solder 216a and the second solder 216b are formed on the first barrier layer 214a and the second barrier layer 214b to a predetermined width. The first solder 216a and the second solder 216b can be formed to have widths equal to or smaller than those of the first barrier layer 214a and the second barrier layer 214b.

First blocking layers 220a and second blocking layers 220b are formed along the first barrier layer 214a and the second barrier layer 214b on the first bonding layer 212a and the second bonding layer 212b, respectively. The functions of the first and second blocking layers 220a and 220b have been described before, and thus will not be repeated. The first blocking layers 220a and the second blocking layers 220b may be formed at a predetermined distance from the first barrier layer 214a and the second barrier layer 214b so that the upper surfaces of the first bonding layer 212a and the second bonding layer 212b can be exposed. The first blocking layer 220a and the second blocking layer 220b can be formed of the same material as that of the first barrier layer 214a and the second barrier layer 214b, that is a metal selected from the group consisting of Pt, Cr, and Ti. The first blocking layer 220a and the second blocking layer 220b may be formed to a thickness greater than the first barrier layer 214a and the second barrier layer 214b. Also, the first blocking layer 220a and the second blocking layer 220b may be formed to the same thickness as the thickness of the first barrier layer 214a and the second barrier layer 214b.

Figure 10:
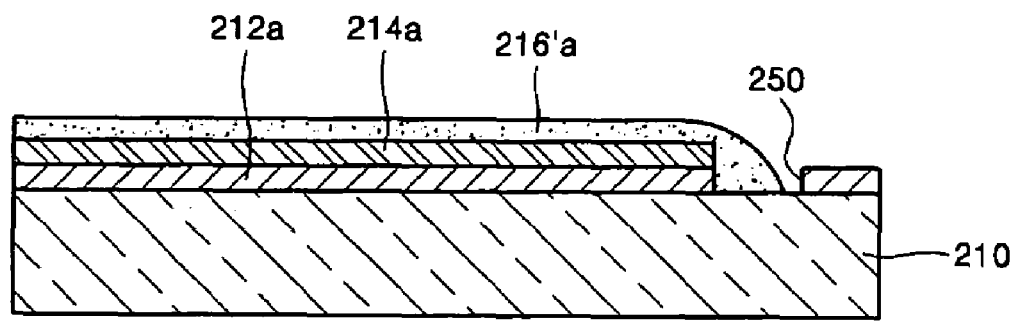
FIG. 10 is a cross-sectional view showing a melted solder formed in a flip chip process for the submount of FIG. 7.

A groove 250 of a predetermined shape is formed on the first bonding layer 212a at an end of the first barrier layer 214a. The groove 250 may be formed to expose the upper surface of the substrate 210. Also, the groove 250 may be formed to have a predetermined depth in the substrate 210. As shown in FIG. 10, the groove 250 stores a melted first solder 216'a flowing toward an end side of a ridge of the submount when a ridge waveguide type light emitting device is bonded to the submount in a flip chip process. The groove 250 can reduce physical damage at an end of the surface of the light emitting device. Although, in the present embodiment, a groove 250 is formed in the first bonding layer 212a, and an end of the first barrier layer 214a are located close to the groove 250, and the groove 250 can be also formed in the second bonding layer 212b, and an end of the second barrier layer 214b may be located close to the groove 250.

Figure 11:
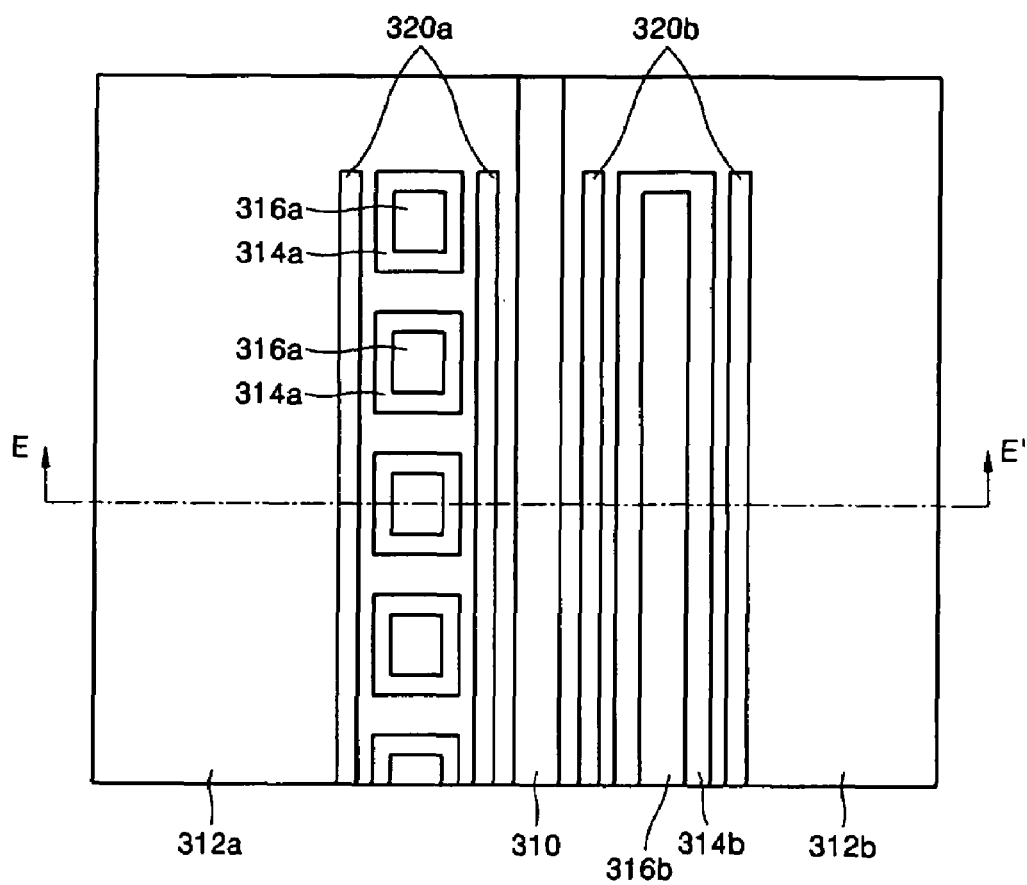
FIG. 11 is a plane view of a submount for a light emitting device package according to another embodiment of the present invention.
Figure 12:
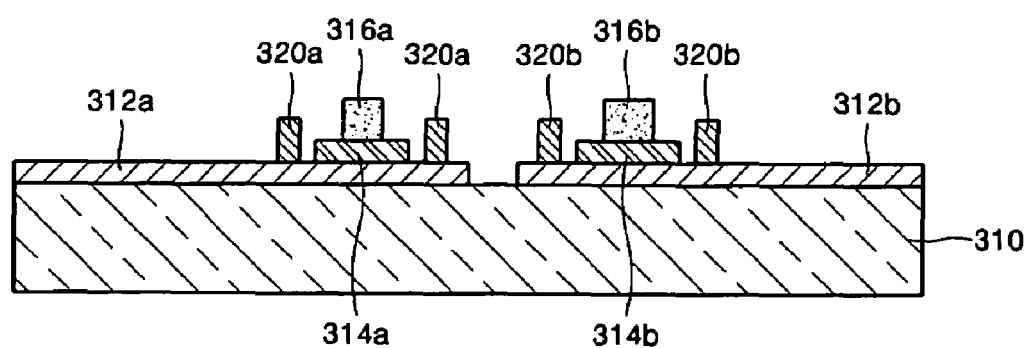
FIG. 12 is a cross-sectional view cut along line E-E' of FIG. 11.

FIG. 11 is a plane view of a submount for a light emitting device package according to another embodiment of the present invention. FIG. 12 is a cross-sectional view cut along line E-E' of FIG. 11.

Referring to FIGS. 11 and 12, a first bonding layer 312a and a second bonding layer 312b are formed on a substrate 210 with a predetermined distance therebetween. A plurality of first barrier layers 314a are formed on the first bonding layer 312a, and a plurality of first solders 316a are formed on the first barrier layers 314a. The first solders 316a can be formed to have a size equal to or smaller than the size of the first barrier layers 314a. In the case when a plurality of first barrier layers 314a and first solders 316a are formed, the amount of the first solder 316a bonded with the ridge of the ridge waveguide type light emitting device in a flip chip process can be controlled. The first barrier layers 314a are arranged in a row in the drawings. However, according to an embodiment of the present invention, the first barrier layers 314a can be arranged in two or more rows, and the arrangement of the barrier layers 314a can vary as well. A second barrier layer 314b is formed in a stripe pattern of a predetermined width on the upper surface of the second bonding layer 312b. A second solder 316b can be formed to have a width equal to or less than that of the second barrier layer 314b. According to an embodiment of the present invention, a plurality of the second barrier layers 314b and a plurality of the second solders 316b can be formed. The first barrier layers 314a and the second barrier layers 314b can be formed of at least a metal selected from the group consisting of Pt, Cr, and Ti. The first solders 316a and the second solders 316b can be formed of an alloy having good melting property and high thermal conductivity.

First blocking layers 320a and second blocking layers 320b are formed along the row of the first barrier layers 314a and the second barrier layers 314b on the first bonding layer 312a and the second bonding layer 312b, respectively. The functions of the first blocking layer 320a and the second blocking layer 320b have been described above. The first blocking layer 320a and the second blocking layer 320b may be formed at a predetermined distance from the row of the first barrier layers 314a and the second barrier layer 314b. The first blocking layer 320a and the second blocking layer 320b can be formed of the same material as the material of the first barrier layer 314a and the second barrier layer 314b, that is a metal selected from the group consisting of Pt, Cr, and Ti. The first blocking layer 320a and the second blocking layer 320b may be formed to have a thickness greater than the thickness of the first barrier layer 314a and the second barrier layer 314b. Also, the first blocking layer 320a and the second blocking layer 320b may be formed to have the same thickness as that of the first barrier layer 314a and the second barrier layer 314b.

As described above, a submount for a light emitting device package of the present invention includes blocking layers formed around a barrier layer to block a melted solder from overflowing in a flip chip process, and thus a short in the light emitting device package can be prevented. Moreover, since the melted solder is adhered to the bonding layer between a barrier layer and a blocking layer, the bonding characteristic is improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A submount for a light emitting device package comprising:
    a substrate;
    a first bonding layer and a second bonding layer which are separately formed on the substrate;
    a first barrier layer and a second barrier layer which are formed on the first bonding layer and on the second bonding layer, respectively;
    a first solder and a second solder which are formed on the first barrier layer and on the second barrier layer, respectively; and
    a first blocking layer and a second blocking layer which are formed around the first barrier layer and the second barrier layer, blocking the melted first solder and the melted second solder from overflowing during a flip chip process.

2. The submount of claim 1, wherein the first blocking layer and the second blocking layer are formed at a predetermined distance from the first barrier layer and the second barrier layer on the first bonding layer and the second bonding layer, respectively.

3. The submount of claim 2, wherein the first blocking layer and the second blocking layer are formed on both sides of the first barrier layer and the second barrier layer, respectively.

4. The submount of claim 2, wherein first blocking layer and the second blocking layer surround the first barrier layer and the second barrier layer, respectively.

5. The submount of claim 2, wherein the first blocking layer and the second blocking layer have a thickness greater than the thickness of the first barrier layer and the second barrier layer.

6. The submount of claim 2, wherein the first blocking layer and the second blocking layer have the same thickness as the first barrier layer and the second barrier layer.

7. The submount of claim 1, wherein the first barrier layer and the second barrier layer are formed in strips of a predetermined width.

8. The submount of claim 2, wherein a groove is further formed in at least one of the first bonding layer and the second bonding layer where ends of the first barrier layer and the second barrier layer are located.

9. The submount of claim 1, wherein a plurality of first barrier layers or second barrier layers are formed.

10. The submount of claim 1, wherein the first blocking layer and the second blocking layer are formed of the same material as the material of the first barrier layer and the second barrier layer.

11. The submount of claim 10, wherein the first blocking layer and the second blocking layer are formed of a material selected from the group consisting of Pt, Cr, and Ti.

12. The submount of claim 1, wherein the first bonding layer and the second bonding layer are formed of Au, Ag, or Al.

13. The submount of claim 1, wherein the substrate is formed of a ceramic or Si.

* * * * *